United States Patent [19]
Anderson

[11] 3,991,461
[45] Nov. 16, 1976

[54] ENCAPSULATED SEMICONDUCTOR DEVICES

[75] Inventor: Thomas Alexander Anderson, London, England

[73] Assignee: Westinghouse Brake & Signal Co. Ltd., England

[22] Filed: Feb. 18, 1976

[21] Appl. No.: 658,885

[30] Foreign Application Priority Data
Mar. 21, 1975 United Kingdom.............. 11877/75

[52] U.S. Cl................................... 29/588; 357/79
[51] Int. Cl.² ........................................ B01J 17/00
[58] Field of Search......................... 29/588; 357/79

[56] References Cited
UNITED STATES PATENTS

| | | | |
|---|---|---|---|
| 3,461,358 | 8/1969 | Lewis.................................. | 29/588 |
| 3,512,249 | 5/1970 | Lewis.................................. | 29/588 |
| 3,683,492 | 8/1972 | Meyerhoff.......................... | 29/588 |
| 3,743,896 | 7/1973 | Weiske ............................... | 29/588 |

*Primary Examiner*—W. Tupman
*Attorney, Agent, or Firm*—Larson, Taylor and Hinds

[57] ABSTRACT

An improved method of constructing a semiconductor device of the encapsulated type wherein a stack of members including a semiconductor element is encapsulated along with spring means ensuring compressive contact to the element contact areas. Hitherto up to five spring washers were needed to keep total spring deflection to within a value giving a desired compressive force, due to accumulated thickness tolerances of the stack members. In the present invention, a plastically deformable member is included in the stack initially along with a thickness gauge member such that bringing together the encapsulation housing parts round the stack flattens a single included spring washer and deforms the deformable member by a certain extent. This certain extent is such that when the stack is re-assembled without the thickness gauge, the plastically deformable member is now of a thickness to cause the spring to deform by an amount giving a desired compression force in the finished stack. A single thickness gauge, which is the only component required to have a very accurate thickness, may be repeatedly re-used in the serial construction of devices by this method.

6 Claims, 5 Drawing Figures

ENCAPSULATED SEMICONDUCTOR DEVICES

This invention relates to semiconductor devices, and relates in particular to encapsulated semiconductor devices constructed by clamping a semiconductor element between contact surfaces in the course of encapsulation.

It is known to construct a semiconductor device by processing a wafer or slice of semiconductive material to produce a semiconductor element having one or several semiconductor junctions therein and also having current-carrying electrodes on opposite faces of the slice or wafer. Contact with these electrodes can be established by soldering connections thereto, but the present invention is concerned with an alternative technique. This alternative known technique involves sandwiching the semiconductor element between metal discs or parts of any other suitable shape and applying compressive forces, for example, by means of springs. Thereby, good electrical and thermal contact is made to the semiconductor element. The compressed sandwich of the semiconductor element, the metallic contacts, and the springs is placed in a housing and sealed into the housing so as to provide a finished, ready-to-use semiconductor device.

A problem exists in the known encapsulation of semiconductor elements in that the compressive spring forces must be regulated to within a relatively narrow range of forces. Too little spring force implies that poor electrical and thermal contact will be made to the semiconductor element, whereas excessive spring force is equally undesirable. Hitherto this requirement for obtaining accurate compressive forces has been met by ensuring that the components which make up the encapsulated assembly have very accurate dimensions. The task of ensuring accurate dimensions causes a significant increase in the difficulty and cost of producing encapsulated semiconductor devices. It is an object of the invention to provide a method which overcomes this problem.

According to the present invention there is provided a method of constructing a semiconductor device in the form of an encapsulated semiconductor element wherein the element is included in a stack with contact members and a resiliently compressible member, the stack being compressed within and between two parts of an encapsulation housing, the method comprising the steps of including in the stack a first additional component which can plastically deform under a compressive force greater than the compressive force necessary to flatten the resiliently deformable member, and initially also including a second additional component of a fixed predetermined thickness, placing the stack of the semiconductor element, the contact members, the resiliently compressible member, and the first and second additional components within and between the two parts of the encapsulation housing, forcing the two parts of the housing together and into their relative positions as in a finished device whereby to compress the stack, flatten the compressible member, and plastically deform the first additional component by a certain extent, subsequently separating the two parts of the housing and removing the second additional component, and then finally bringing the two housing parts together again around the stack and sealing the two housing parts together such that the stack is compressed with the compressible member partly flattened and exerting a compressive force on the stack within a predetermined range of compressive forces, the correctness of this compressive force being determined by the thickness of the first additional component after it has been permanently thinned by plastic deformation during the initial compression of the stack.

The first additional component may be a fan-disc washer comprising a metal washer having a serrated periphery with the segments of the periphery formed by the serrations being twisted relative to the plane of the washer.

The first additional component may alternatively be a wavy washer comprising a metal washer having circumferential undulations.

The resiliently compressible member may be a spring washer such as a Belleville washer.

The invention also comprises a semiconductor device which is the product of the above method.

In order that the invention may be more clearly understood and readily put into effect, an embodiment of the same will now be described by way of example, with reference to the accompanying drawings, wherein.

Figure 1:
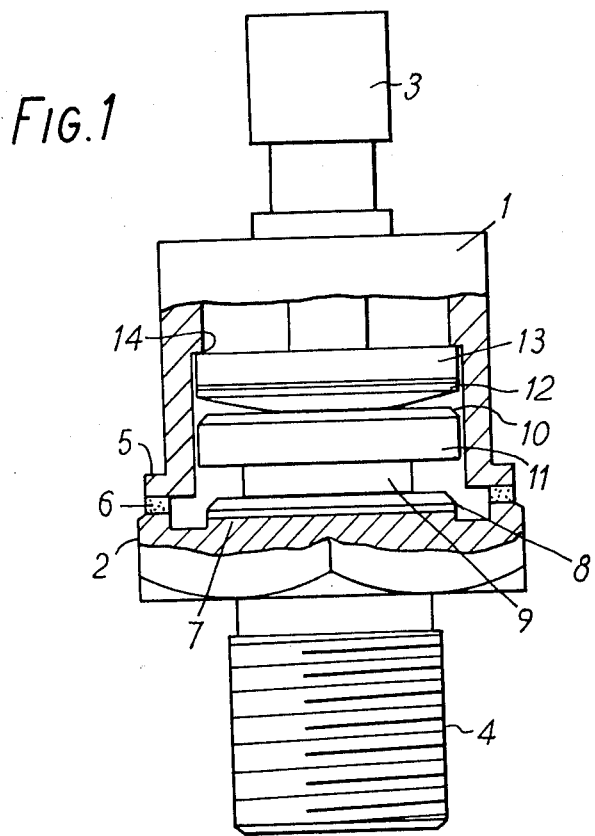
FIG. 1 is a vertical section of an embodiment of an encapsulated semiconductor device.
Figure 2:
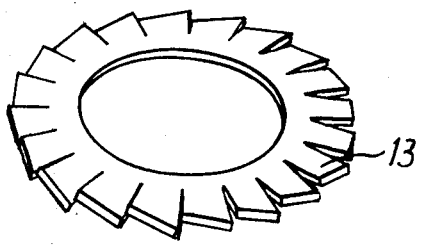
FIG. 2 is a perspective view of a first form of a component of the embodiment.
Figure 3:
FIGS. 3 and 4 are respectively side and plan views of a second form of a component of the embodiment.
Figure 4:
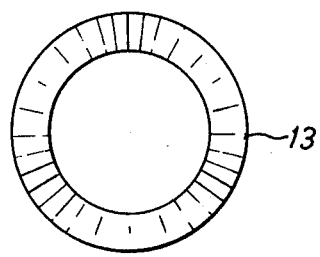

Referring first to FIG. 1, an encapsulated semiconductor device in accordance with the invention includes a first encapsulation housing part 1 and a second encapsulation housing part 2, the part 1 having a terminal cap 3 and the part 2 having a threaded mounting stud 4. The part 1 is formed with a flange 5 which is weldable via a ring 6 to the lower part 2. The lower housing part 2 is provided with an upstanding platform portion 7 which is the lowermost part of a stack of members and components encapsulated by the housing parts 1 and 2 in the finished semiconductor device. On top of the platform portion 7 is a semiconductor element 8. The element 8 is contacted by a contact member 9. On top of the contact member 9 is an electrically insulating ring 11 on top of which is a steel washer 10. Bearing on top of the washer 10 is a Belleville spring washer 12 which is a spring-steel compressible washer of well-known form. The stack is topped by a first additional component 13 in the form of a plastically deformable (permanently compressible) metal washer of the form shown either in FIG. 2 or in FIGS. 3 and 4. The washer 13 shown in FIG. 2 is a fan-disc locking washer of the type sold by the Fan Disc Company Limited of 101-111 Holloway Head, Birmingham B1 1QU, England. The washer 13 comprises a flat sheet metal ring which is serrated around its periphery with the peripheral segments formed by the serration being given a twist relative to the plane of the washer, as may be seen in the drawing. The alternative form of washer 13 shown in edge view in FIG. 3 and in plan view in FIG. 4 is a sheet-steel ring which is deformed so as to have a number (in the illustrated case, three) of undulations around its circumference. The washer shown in FIGS. 3 and 4 is a "wavy washer" as sold by The Lewis Spring Company Limited, of Studley Road, Redditch, Worcestershire, England.

In assembly of the embodiment of semiconductor device now being described, the stack of parts is put together as shown in FIG. 1 within the housing parts 1 and 2, and a second additional component (not shown) which is disc-shaped, rigid and of a predetermined thickness is placed between the platform 7 and the element 8. The first housing part 1 is then compressed downwardly onto the second housing part 1, and the aforementioned stack of parts is compressed between an internal shoulder 14 on the part 1, and the platform 7 on the part 2. As the parts 1 and 2 are brought together, the Belleville spring washer 12 is completely flattened by the compressive forces and because of the extra height of the stack due to the added second component, and subsequent coming together of the parts 1 and 2 is taken up in the stack by plastic (permanent) compressive deformation of the deformable component 13. After the parts 1 and 2 are compressed together, a sealing or joining operation is not made, but the parts 1 and 2 are separated to the extent that the second additional component can be removed from the stack. After the second additional component is removed, the parts 1 and 2 are again brought together around the stack, and this time the parts 1 and 2 are permanently sealed together by welding through the ring 6 to form a finished encapsulated semiconductor device. Because the second additional component is no longer in the stack, the Belleville spring washer 12 is not fully compressed, but is partly compressed by an amount determined by the permanent deformation of the component 13 caused by the foregoing operation. This partial compression of the Belleville spring washer 12 exerts a spring force on the stack and in consequence, the element 8 in the finished encapsulated device receives a compressive force which is within a correct range of values. The permanent compression of the component 13 will vary between different devices according to the variation in the heights of the stacks due to the manufacturing tolerances in the thicknesses of the parts forming the stacks. Regardless of this variation, in each case the final thickness of the component 13 after permanent deformation will be at the value appropriate to cause compression, in the finished device, of the Belleville spring washer 12 by a fixed amount and so yield the correct compressive spring forces desired. In each case the final thickness of the component 13 will be such that the Belleville spring washer 12 will in final use be compressed to a thickness equal to its totally flattened thickness plus the thickness of the second additional component.

Figure 5:
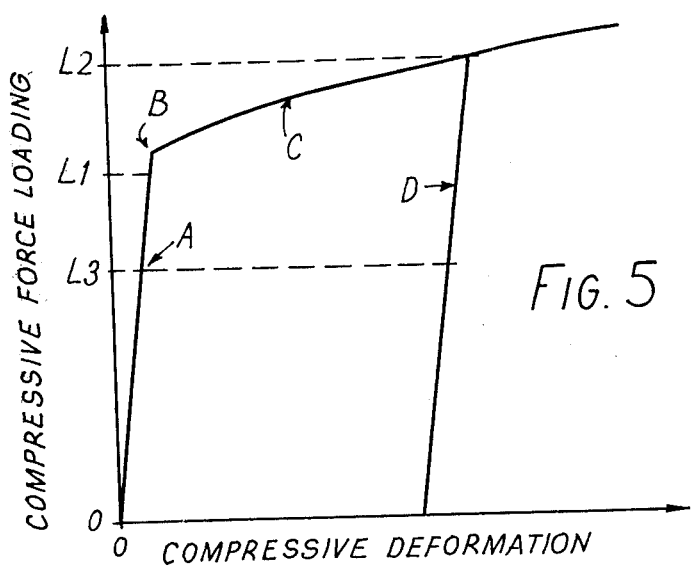
FIG. 5 is a graphical illustration of the force/deformation curves of a component of the invention.

A suitable relationship between the compressive forces and compressive deformation experienced by the component 13 is illustrated in FIG. 5. FIG. 5 is a graph, with the vertical axis being indicative of compressive force loading, and the horizontal axis being indicative of deformation. Scales are not given, because FIG. 5 is purely demonstrative and not limiting in any way. Referring now to FIG. 5 in detail, the inherent elasticity of the material of the component 13 will permit a limited elastic deformation as shown by the portion A of the characteristic. At the limit point B of elastic deformation, subsequent additional loading will produce a substantial deformation along the portion C of the load/deformation characteristic, and this occurs in excess of a loading L1 at which the Belleville spring washer 12 is fully flattened. The housing parts 1 and 2 initially come together, with the second additional component in place, when exerting a compressive force L2. Subsequent separation of the housing parts 1 and 2, to allow removal of the second additional component, allows the component 13 to expand along the characteristic D. The graph of FIG. 5 will be familiar to those skilled in the art of combined elastic and plastic deformation of articles. In the final assembly described above, the Belleville spring washer 12 is loaded by partial compression to an extent denoted by the loading force level L3. The elasticity of the component 13 is minimal in comparison to the elasticity of the Belleville spring washer 12, and is unimportant in design considerations whereas it is the plastic (permanent) deformability that is important.

The second additional component can be re-used for the encapsulation of successive semiconductor elements, and so its cost is relatively unimportant, i.e. the cost of obtaining an accurate thickness related to the desired final spring compression is spread over many devices and thereby becomes a minimal fraction of the cost of any individual device.

By utilising the method of the present invention, it is possible to construct a semiconductor device in which the thickness tolerances of the component parts before assembly may be substantially greater than in arrangement which does not make use of a deformable member as described above. As a result of this, in a practical construction, it is possible to produce an assembly which uses the reduced tolerances which have to be accomodated, substantially fewer Belleville spring washers being utilised in making up a complete resiliently compressible member for providing the predetermined compressive force.

Modifications and variations in the above described arrangement may be made within the scope of the appended claims. For example, plastically deformable components of shapes other than those specifically shown in FIGS. 2, 3, and 4 may be employed. Resiliently compressible members other than Belleville spring washers may be employed. The invention can be applied to the encapsulation of diodes, transistors, thyristors, triacs, and other semiconductor devices.

I claim:

1. A method of constructing a semiconductor device in the form of an encapsulated semiconductor element wherein the element is included in a stack with contact members and a resiliently compressible member, the stack being compressed within and between two parts of an encapsulation housing, the method comprising the steps of including in the stack a first additional component which can plastically deform under a compressive force greater than the compressive force necessary to flatten the resiliently deformable member, and initially also including a second additional component of a fixed predetermined thickness, placing the stack of the semiconductor element, the contact members, the resiliently compressible member, and the first and second additional components within and between the two parts of the encapsulation housing, forcing the two parts of the housing together and into their relative positions as in a finished device whereby to compress the stack, flatten the compressible member, and plastically deform the first additional component by a certain extent, subsequently separating the two parts of the housing and removing the second additional component, and then finally bringing the two housing parts together again around its stack and sealing the two housing parts together such that the stack is compressed with the compressible member partly flattened and exerting a compressive force on the stack within a predetermined range of compressive forces, the correctness of this compressive force being determined by the thickness of the first additional component after it has been permanently thinned by plastic deformation during the initial compression of the stack.

2. A method according to claim 1, wherein the first additional component is a fan-disc washer comprising a metal washer having a serrated periphery with the segments of the periphery formed by the serrations being twisted relative to the plane of the washer.

3. A method according to claim 1, wherein the first additional component is a wavy washer comprising a metal washer having circumferential undulations.

4. A method according to claim 1, wherein the resiliently compressible member is a spring washer.

5. A method according to claim 4, wherein the spring washer is a Belleville spring washer.

6. A semiconductor device when constructed according to the method claimed in claim 1.

* * * * *